US011953574B2

(12) United States Patent
Jain et al.

(10) Patent No.: US 11,953,574 B2
(45) Date of Patent: Apr. 9, 2024

(54) SYSTEMS AND METHODS OF ACCELERATED PROPELLER MAGNETIC RESONANCE IMAGING

(71) Applicant: GE PRECISION HEALTHCARE LLC, Wauwatosa, WI (US)

(72) Inventors: Nitin Jain, Karnataka (IN); Rajagopalan Sundaresan, Karnataka (IN); Harsh Agarwal, Karnataka (IN); Ramesh Venkatesan, Karnataka (IN)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 149 days.

(21) Appl. No.: 17/715,617

(22) Filed: Apr. 7, 2022

(65) Prior Publication Data
US 2023/0324487 A1 Oct. 12, 2023

(51) Int. Cl.
*G01R 33/561* (2006.01)
*G01R 33/48* (2006.01)
*G01R 33/565* (2006.01)

(52) U.S. Cl.
CPC ....... *G01R 33/561* (2013.01); *G01R 33/4818* (2013.01); *G01R 33/56509* (2013.01)

(58) Field of Classification Search
CPC .............. G01R 33/4818; G01R 33/561; G01R 33/56509
See application file for complete search history.

(56) References Cited

U.S. PATENT DOCUMENTS

| 7,382,127 | B2 | 6/2008 | Gaddipati et al. |
| 2010/0117645 | A1 | 5/2010 | Eggers et al. |
| 2016/0274209 | A1* | 9/2016 | Dannels ............ G01R 33/4824 |
| 2018/0188343 | A1* | 7/2018 | Liu ........................ A61B 5/055 |
| 2023/0184861 | A1* | 6/2023 | Nickel ............... G01R 33/4824 |
| | | | 324/309 |

OTHER PUBLICATIONS

James G. Pipe, Wende N. Gibbs, Ziqiang Li, et al., "Revised Motion Estimation Algorithm for PROPELLER MRI", Magnetic Resonance in Medicine, 2014, 72:430-437.
Gordon E. Sarty et al., "Direct Reconstruction of Non-Cartesian k-Space Data Using a Nonuniform Fast Fourier Transform", Magnetic Resonance in Medicine, 2001, 45:908-915.
Konstantinos Arfanakis et al., "k-Space Undersampling in PROPELLER Imaging", Magnetic Resonance in Medicine, 2005, 53:675-683.
James G. Pipe, "Motion Correction with PROPELLER MRI: Application to Head Motion and Free-Breathing Cardiac Imaging", Magnetic Resonance in Medicine, 1999, 42:963-969.
(Continued)

*Primary Examiner* — Gregory H Curran
(74) *Attorney, Agent, or Firm* — Armstrong Teasdale LLP

(57) ABSTRACT

A magnetic resonance (MR) imaging acceleration method is provided. The method includes applying, by an MR system, a pulse sequence having a k-space trajectory of a plurality of blades being rotated in k-space, each blade including a plurality of views, wherein the k-space trajectory has an undersampling pattern in the k-space. The method also includes receiving k-space data of a subject acquired by the pulse sequence, reconstructing MR images of the subject based on the k-space data using compressed sensing, and outputting the reconstructed images.

19 Claims, 14 Drawing Sheets

(56) References Cited

OTHER PUBLICATIONS

V. Rasche et al., "Resampling of Data Between Arbitrary Grids Using Convolution Interpolation", IEEE Transaction on Medical Imaging, vol. 18, No. 5, May 1999, 385-392.
Michael Lustig et al., "Sparse MRI: the Application of Compressed Sensing for Rapid MR Imaging", Magnetic Resonance in Medicine, 2007, 58:1182-1195.
Ashish A. Tamhane et al., "Iterative Image Reconstruction for PROPELLER-MRI Using the Nonuniform Fast Fourier Transform", Journal of Magnetic Resonance Imaging, 2010, 32:211-217.
Steven Conolly et al., "Variable-Rate Selective Excitation", Journal of Magnetic Resonance, 1988, 440-458.
Brian A. Hargreaves et al., "Variable-Rate Selective Excitation for Rapid MRI Sequences", Magnetic Resonance in Medicine, 2004, 52:590-597.
Jeffrey A. Fessler et al., "Nonuniform Fast Fourier Transforms Using Min-Max Interpolation", IEEE T-SP, 51(2):560-74, Feb. 2003, 19 pgs.

\* cited by examiner

SYSTEMS AND METHODS OF ACCELERATED PROPELLER MAGNETIC RESONANCE IMAGING

BACKGROUND

The field of the disclosure relates generally to systems and methods of imaging acceleration, and more particularly, to systems and methods of magnetic resonance (MR) imaging acceleration in a PROPELLER (Periodically Rotated Overlapping ParallEL Lines with Enhanced Reconstruction) acquisition.

Magnetic resonance imaging (MRI) has proven useful in diagnosis of many diseases. MRI provides detailed images of soft tissues, abnormal tissues such as tumors, and other structures, which cannot be readily imaged by other imaging modalities, such as computed tomography (CT). Further, MRI operates without exposing patients to ionizing radiation experienced in modalities such as CT and x-rays.

Compared to a Cartesian sampling, although relatively insensitive to motion, a PROPELLER sampling scheme has a relatively long scan time. Therefore, imaging acceleration is needed. Known imaging acceleration methods are disadvantaged in some aspects and improvements are desired.

BRIEF DESCRIPTION

In one aspect, a magnetic resonance (MR) imaging acceleration method is provided. The method includes applying, by an MR system, a pulse sequence having a k-space trajectory of a plurality of blades being rotated in k-space, each blade including a plurality of views, wherein the k-space trajectory has an undersampling pattern in the k-space. The method also includes receiving k-space data of a subject acquired by the pulse sequence, reconstructing MR images of the subject based on the k-space data using compressed sensing, and outputting the reconstructed images.

In another aspect, an MR imaging acceleration system is provided. The system includes an imaging acceleration computing device, the imaging acceleration computing device including at least one processor in communication with at least one memory device. The at least one processor is programmed to receive k-space data of a subject acquired by a pulse sequence having a k-space trajectory of a plurality of blades being rotated in k-space, each blade including a plurality of views, wherein the k-space trajectory has an undersampling pattern. The at least one processor is also programmed to reconstruct MR images of the subject based on the k-space data using compressed sensing, and output the reconstructed images.

DRAWINGS

DETAILED DESCRIPTION

The disclosure includes systems and methods of imaging acceleration in a PROPELLER (Periodically Rotated Overlapping ParallEL Lines with Enhanced Reconstruction) technique for acquiring images of a subject. As used herein, a subject is a human, an animal, or a phantom. Slices of images acquired by 2D PROPELLER is described herein as an example only. The systems and methods disclosed herein may be applied to imaging acceleration in 3D PROPELLER, such as images acquired by PROPELLER in a plurality of slice-encoding steps. Method aspects will be in part apparent and in part explicitly discussed in the following description.

In magnetic resonance imaging (MRI), a subject is placed in a magnet. When the subject is in the magnetic field generated by the magnet, magnetic moments of nuclei, such as protons, attempt to align with the magnetic field but precess about the magnetic field in a random order at the nuclei's Larmor frequency. The magnetic field of the magnet is referred to as B0 and extends in the longitudinal or z direction. In acquiring an MRI image, a magnetic field (referred to as an excitation field B1), which is in the x-y plane and near the Larmor frequency, is generated by a radiofrequency (RF) coil and may be used to rotate, or "tip," the net magnetic moment Mz of the nuclei from the z direction to the transverse or x-y plane. A signal, which is referred to as an MR signal, is emitted by the nuclei, after the excitation signal B1 is terminated. To use the MR signals to generate an image of a subject, magnetic field gradient pulses (Gx, Gy, and Gz) are used. The gradient pulses are used to scan through the k-space, the space of spatial frequencies or inverse of distances. A Fourier relationship exists between the acquired MR signals and an image of the subject, and therefore the image of the subject can be derived by reconstructing the MR signals.

Figure 1:
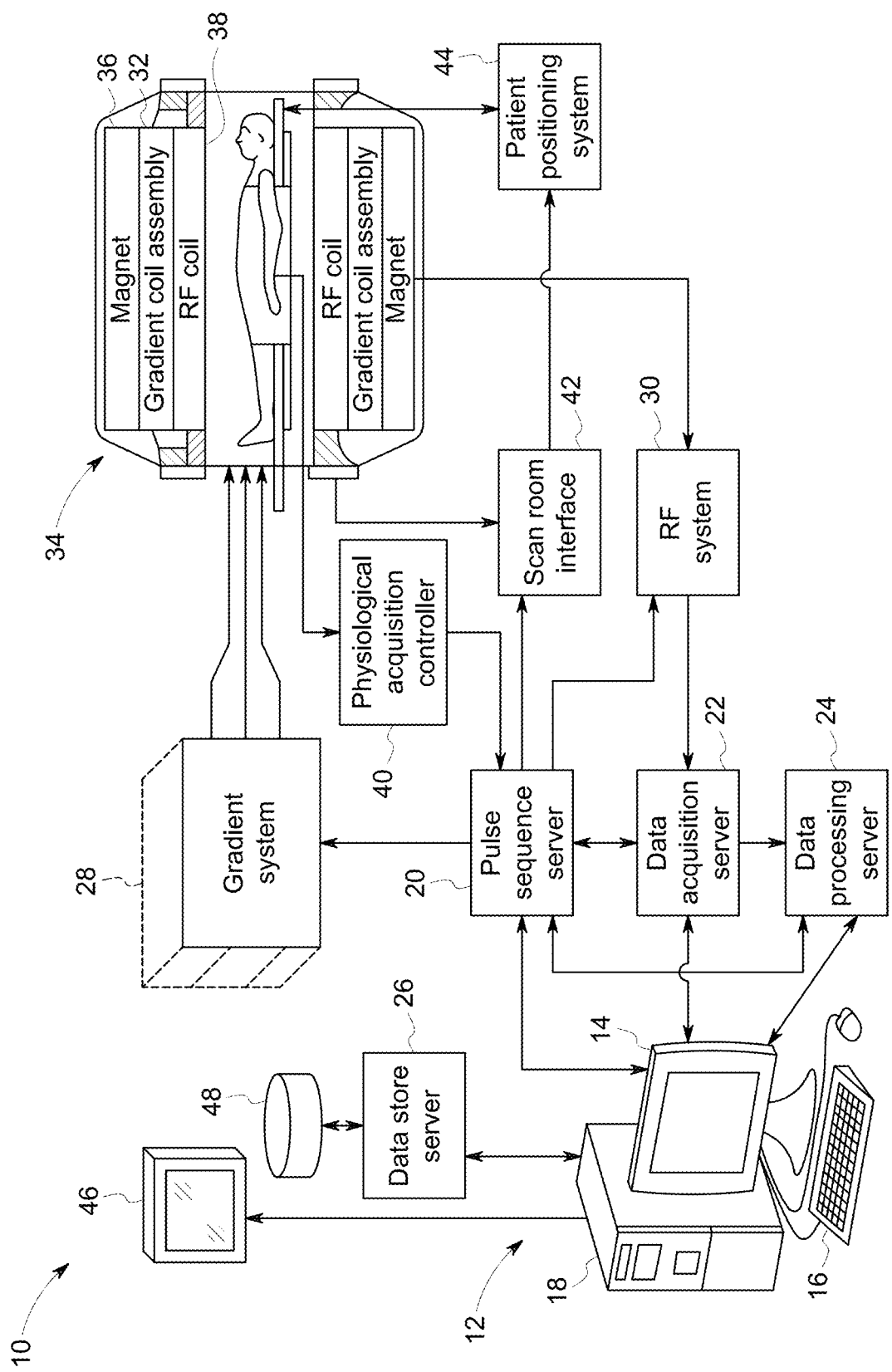
FIG. 1 is a schematic diagram of an exemplary magnetic resonance imaging (MRI) system.

FIG. 1 illustrates a schematic diagram of an exemplary MRI system 10. In the exemplary embodiment, MRI system 10 includes a workstation 12 having a display 14 and a keyboard 16. Workstation 12 includes a processor 18, such as a commercially available programmable machine running a commercially available operating system. Workstation 12 provides an operator interface that allows scan prescriptions to be entered into MRI system 10. Workstation 12 is coupled to a pulse sequence server 20, a data acquisition server 22, a data processing server 24, and a data store server 26. Workstation 12 and each server 20, 22, 24, and 26 communicate with each other.

In the exemplary embodiment, pulse sequence server 20 responds to instructions downloaded from workstation 12 to operate a gradient system 28 and a radiofrequency ("RF") system 30. The instructions are used to produce gradient and RF waveforms in MR pulse sequences. An RF coil 38 and a gradient coil assembly 32 are used to perform the prescribed MR pulse sequence. RF coil 38 is shown as a whole body RF coil. RF coil 38 may also be a local coil that may be placed in proximity to the anatomy to be imaged, or a coil array that includes a plurality of coils.

In the exemplary embodiment, gradient waveforms used to perform the prescribed scan are produced and applied to gradient system 28, which excites gradient coils in gradient coil assembly 32 to produce the magnetic field gradients $G_x$, $G_y$, and $G_z$ used for position-encoding MR signals. Gradient coil assembly 32 forms part of a magnet assembly 34 that also includes a polarizing magnet 36 and RF coil 38.

In the exemplary embodiment, RF system 30 includes an RF transmitter for producing RF pulses used in MR pulse sequences. The RF transmitter is responsive to the scan prescription and direction from pulse sequence server 20 to produce RF pulses of a desired frequency, phase, and pulse amplitude waveform. The generated RF pulses may be applied to RF coil 38 by RF system 30. Responsive MR signals detected by RF coil 38 are received by RF system 30, amplified, demodulated, filtered, and digitized under direction of commands produced by pulse sequence server 20. RF coil 38 is described as a transmitter and receiver coil such that RF coil 38 transmits RF pulses and detects MR signals. In one embodiment, MRI system 10 may include a transmitter RF coil that transmits RF pulses and a separate receiver coil that detects MR signals. A transmission channel of RF system 30 may be connected to a RF transmission coil and a receiver channel may be connected to a separate RF receiver coil. Often, the transmission channel is connected to the whole body RF coil 38 and each receiver section is connected to a separate local RF coil.

In the exemplary embodiment, RF system 30 also includes one or more RF receiver channels. Each RF receiver channel includes an RF amplifier that amplifies the MR signal received by RF coil 38 to which the channel is connected, and a detector that detects and digitizes the I and Q quadrature components of the received MR signal. The magnitude of the received MR signal may then be determined as the square root of the sum of the squares of the I and Q components as in Eq. (1) below:

$$M=\sqrt{I^2+Q^2} \quad (1);$$

and the phase of the received MR signal may also be determined as in Eq. (2) below:

$$\varphi = \tan^{-1}\left(\frac{Q}{I}\right). \quad (2)$$

In the exemplary embodiment, the digitized MR signal samples produced by RF system 30 are received by data acquisition server 22. Data acquisition server 22 may operate in response to instructions downloaded from workstation 12 to receive real-time MR data and provide buffer storage such that no data is lost by data overrun. In some scans, data acquisition server 22 does little more than pass the acquired MR data to data processing server 24. In scans that need information derived from acquired MR data to control further performance of the scan, however, data acquisition server 22 is programmed to produce the needed information and convey it to pulse sequence server 20. For example, during prescans, MR data is acquired and used to calibrate the pulse sequence performed by pulse sequence server 20. Also, navigator signals may be acquired during a scan and used to adjust the operating parameters of RF system 30 or gradient system 28, or to control the view order in which k-space is sampled.

In the exemplary embodiment, data processing server 24 receives MR data from data acquisition server 22 and processes it in accordance with instructions downloaded from workstation 12. Such processing may include, for example, Fourier transformation of raw k-space MR data to produce two or three-dimensional images, the application of filters to a reconstructed image, the performance of a back-projection image reconstruction of acquired MR data, the generation of functional MR images, and the calculation of motion or flow images.

In the exemplary embodiment, images reconstructed by data processing server 24 are conveyed back to, and stored at, workstation 12. In some embodiments, real-time images are stored in a database memory cache (not shown in FIG. 1), from which they may be output to operator display 14 or a display 46 that is located near magnet assembly 34 for use by attending physicians. Batch mode images or selected real time images may be stored in a host database on disc storage 48 or on a cloud. When such images have been reconstructed and transferred to storage, data processing server 24 notifies data store server 26. workstation 12 may be used by an operator to archive the images, produce films, or send the images via a network to other facilities.

Systems and methods described herein provide imaging acceleration using an accelerated PROPELLER pulse sequence. Images acquired by the accelerated pulse sequence have a reduced scan time and reduced effects from motion, rendering the pulse sequence suitable for applications in which motion is prevalent and/or difficult to control. The images are reconstructed using compressed sensing, thereby reducing artifacts in the images. Phase and/or motion corrections may be applied to improve the image quality of the reconstructed images. Non-uniform Fourier transform (NUFFT) is used in compressed sensing and phase/or motion corrections to reconstruct the undersampled k-space data.

Figure 2A:
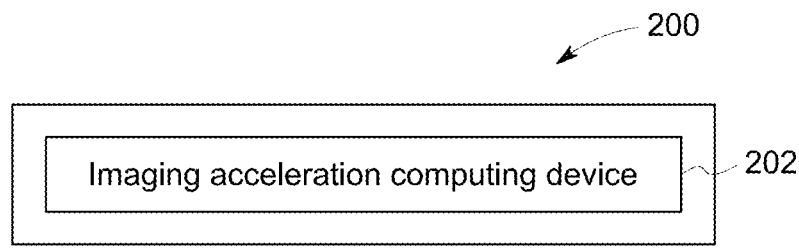
FIG. 2A is a schematic diagram of an exemplary imaging acceleration system.

FIG. 2A is a schematic diagram of an exemplary imaging acceleration system 200. In the exemplary embodiment, system 200 includes an imaging acceleration computing device 202 configured to accelerate MR imaging. The imaging acceleration computing device 202 may be included in workstation 12 of MRI system 10, or may be included in a separate computing device that is in communication with workstation 12, through wired or wireless communication. In one example, imaging acceleration computing device 202 is a server computing device, and may be cloud-based. In some embodiments, imaging acceleration computing device 202 is a separate computing device from workstation 12 and receives MR images acquired by workstation 12 through a portable storage device, such as a flash drive or a thumb drive.

Figure 2B:
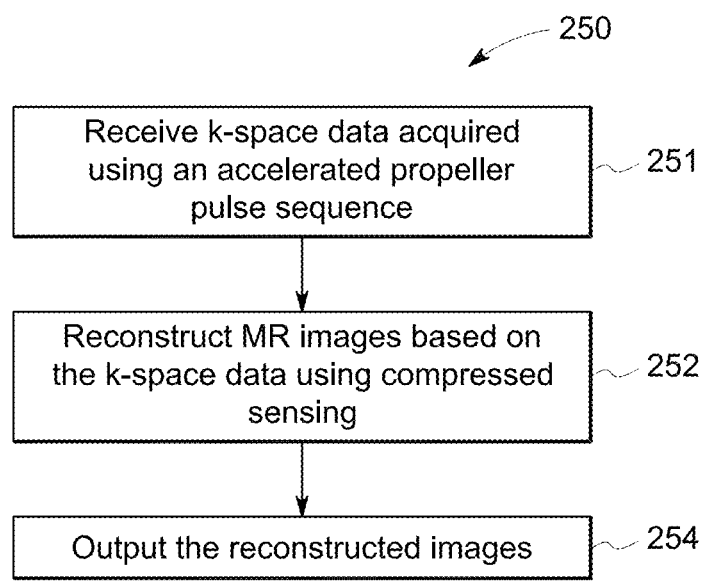
FIG. 2B is a flow chart of an exemplary method of imaging acceleration.

FIG. 2B is a flow chart of an exemplary method 250 of imaging acceleration. Method 250 may be implemented using imaging acceleration computing device 202. In the exemplary embodiment, method 250 includes receiving 251 k-space data acquired by an MR system by rotating a blade in the k-space, each blade including a plurality of views.

A pulse sequence including rotating a blade having a plurality of views in the k-space may be referred to as a PROPELLER pulse sequence. PROPELLER may be applied in slices or in a two-dimensional (2D) manner, where the 3D imaging volume includes a plurality of slices, a slice is selected by a z gradient, and the kx-ky plane corresponding to that slice is sampled in a PROPELLER manner, i.e., by rotating a blade in the kx-ky plane of that slice. Alternatively, the k-space data may be acquired by a PROPELLER sequence in a plurality of slice-encoding steps or in a 3D manner. For example, the 3D k-space (kx-ky-kz) is sampled by stacks of blade sampling kx-ky planes along the kz direction, where kz corresponds to a slice encoding step. That is, the k-space data are acquired by rotating a blade in a kx-ky plane corresponding to a slice-encoding step. Final images are derived by applying a Fourier transform in the kz dimension, as well as in the kx and ky dimensions. The 3D k-space data may be Fourier transformed in the kz direction to derive k-space data of a plurality of slices, which are processed similarly to k-spaced data acquired in a 2D manner.

In the exemplary embodiment, the k-space data are acquired by an accelerated PROPELLER sequence having an undersampling pattern, where part of the k-space is not sampled, unlike conventional PROPELLER. The undersampling pattern may be undersampling in the number of views in a view undersampling pattern, in the number of slices or slice encoding steps in a blade undersampling pattern, or in both the number of views and number of slices.

In the exemplary embodiment, method 250 also includes reconstructing 252 MR images based on the k-space data. In some embodiments, reconstructing 252 further includes applying phase correction and/or motion correction. In one example, the images are reconstructed by compressed sensing based on the k-space data. An NUFFT of the k-space data may be used as an initial estimate of the images. Method 250 further includes outputting 254 the reconstructed images.

Figure 3A:
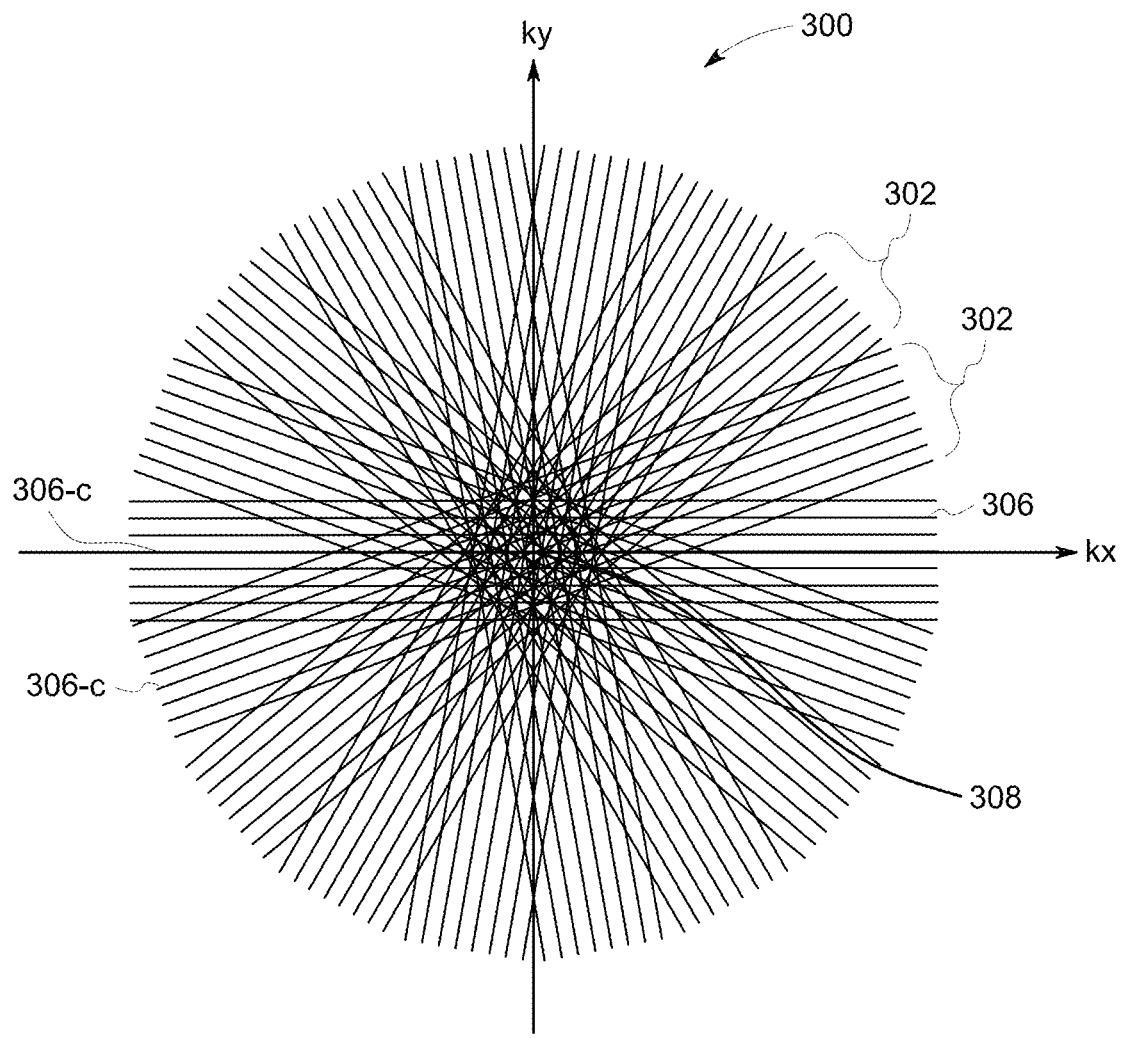
FIG. 3A shows a k-space trajectory of a known PROPELLER pulse sequence.
Figure 3B:
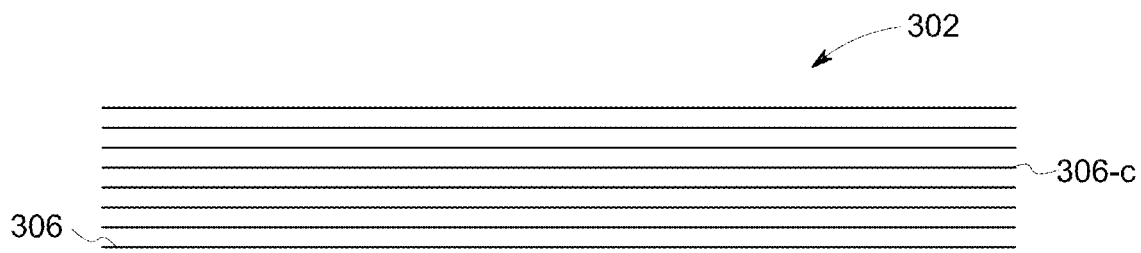
FIG. 3B shows a blade of the k-space trajectory shown in FIG. 3A.

FIGS. 3A-3B show a known PROPELLER k-space sampling scheme. FIG. 3A is a schematic diagram of a k-space trajectory 300 of a PROPELLER sampling scheme. FIG. 3B shows a blade 302 of k-space trajectory 300 in the PROPELLER sampling scheme. In a PROPELLER sampling scheme, the k-space is sampled by a PROPELLER pulse sequence, where the k-space is sampled by rotating blades 302 with each blade 302 having a plurality of views 306. An image acquired by PROPELLER may be referred to as a PROPELLER image. In MR, a pulse sequence is a sequence of RF pulses, gradient pulses, and data acquisition applied by MRI system 10 in acquiring MR signals. As described above, in MRI, the MR signals are acquired by sampling the k-space with gradients Gx, Gy, Gz, which correspond to kx/frequency-encoding direction, ky/phase-encoding direction, and kz/slice-encoding direction, respectively. An MR image may be reconstructed from the MR signals using Fourier transform. The k-space is typically sampled along a Cartesian grid, where the k-space sampling points are in a rectilinear pattern. The advantage of Cartesian sampling is that data points are regularly spaced and can be placed directly into standard array processors designed for fast Fourier Transform (FFT) computations. The disadvantage of Cartesian sampling is the Cartesian sampling method's sensitivity to motion.

A PROPELLER pulse sequence does not sample the k-space along the Cartesian grid. Instead, a PROPELLER pulse sequence samples the k-space in a radial pattern, where the k-space lines radially span from the center region of the k-space, and is categorized as a radial sampling scheme. Compared to a standard radial acquisition, which samples one line after an RF excitation pulse, in a PROPELLER sampling scheme, a blade 302 that includes a plurality of views or k-space lines 306 is sampled after an RF excitation pulses through fast spin echo sampling or other manners such as gradient echo. The number of views 306 in one blade 302 typically may be between 16 and 32. The views 306 in a blade 302 are generally parallel to one another, where a center view 306-c of blade 302 may go through center 308 of the k-space. After a blade 302 at a certain angle is acquired, blade 302 rotates by an angle at which time second, third, and so on sets of data are acquired. This process continues until MR data from the entire k-space plane for all slices/slice encoding steps have been collected.

Compared to other imaging modalities, MRI is unique in that an MRI signal is represented by a complex number, rather than a scalar or a real number. The image value for each image pixel, therefore, includes a magnitude and a phase. Complex MR images may be reconstructed based on I and Q quadrature MR signals, using processes such as Fourier transform.

The major benefit of radial sampling is its relative insensitivity to motion. Unlike Cartesian sampling, radial sampling does not have fixed frequency and phase-encoding directions. Noise from moving anatomic structures does not propagate as discrete ghosts, blurring, or artifacts along a single phase-encoding direction. In radial sampling, such noise is distributed diffusely across the entire image. Further, because the center region of the k-space is oversampled, all radial lines make equal contributions to the image and include signals with a relatively-high intensity from the center region of the k-space, unlike Cartesian sampling, which only samples the center region of k-space over a few lines. As a result, motion during one or a few radial lines has less likelihood to severely degrade image quality.

Compared to other radial sampling pulse sequences such as a radial pulse sequence, PROPELLER is also advantageous. Unlike other radial sampling sequences where only the center of the k-space is sampled multiple times, in PROPELLER, a center region is oversampled. The redundancy in k-space data at the center region may be used to check inconsistencies from other blades. If the patient moves between blades, the data for the second blade may be motion corrected based on the inconsistency in the center region.

PROPELLER pulse sequences are therefore used in applications where motion is prevalent. For example, in abdominal applications, respiratory motion mitigation methods are needed, requiring additional equipment and/or time for setup and scanning, and may fail or function unsatisfactorily. In some applications, subjects have difficulty or are otherwise unable to remain still during scanning, such as fetal imaging, pediatric imaging, or imaging of subjects having Parkinson's disease or head injury. Especially in fetal imaging, fetal motion cannot be controlled and MR is the only medical imaging modality that does not have radiation and provides image contrast of soft tissue such as spinal or neurological studies that is sufficient for clinical diagnosis. PROPELLER is also advantageous in imaging anatomies that is off iso-center of magnet 36. The magnetic field of the system 10 at locations away from the iso-center of the magnet 36 is not as uniform as locations near or at the iso-center, and this nonuniformity presents as phase variations in the k-space data. Because MR acquires data in k-space, motion presents as phase changes in the k-space data, imaging of non iso-center anatomies is more sensitive to motion than anatomies at or near the iso-center.

In addition, compared to Cartesian sampling and some other non-Cartesian sampling schemes such as spiral imaging, PROPELLER imaging has a relatively high SNR. In low cost systems such as systems having the body coil only, SNR is relatively low, rendering PROPELLER more suitable for clinical applications than other pulse sequences.

However, compared to cartesian sampling and other radial sampling schemes, PROPELLER imaging has a relatively long scan time. Therefore, it is desirable to reduce scan time of PROPELLER. Reduction in scan time also mitigates motion such that acquired k-space data have a reduced amount of data being affected by motion. Systems and methods described herein provide an improved PROPELLER imaging that reduces scan time without compromising image quality of the images.

In the exemplary embodiment, the pulse sequence is an accelerated PROPELLER. Compared to k-space trajectory 300 shown in FIGS. 3A and 3B, an accelerated pulse sequence has a reduced view number and/or reduced blade number by an acceleration factor. A view number is the number of views in a blade. A blade number is the number of blades in one kx-ky plane. In known PROPELLER, blade numbers are in the range from 10 to 24. In prescribing an imaging protocol, a matrix size of the images and length of echo train, the number of echoes acquired after application of an RF excitation pulse, may be prescribed. For a PROPELLER sequence, the length of echo train corresponds to the view number. Because the k-space is sampled by rotating blades 302, the equivalent matrix size M is given by the equation of view number×blade number=πM/2, which indicates a factor of π/2 times as long as coverage using a Cartesian method is needed. That is, to fully cover the k-space corresponding to the same matrix size and field of view (FOV), the product of the view number and the blade number in PROPELLER needs to be π/2 times of the prescribed matrix size. A coverage factor, the product of the view number and the blade number over the prescribed matrix size, of the PROPELLER sequence may be specified.

In the exemplary embodiment, the view number and/or blade number may be reduced by an acceleration factor. As used herein, an acceleration factor is the factor that the view number or the blade number is reduced from a prescribed view number or a prescribed blade number. A prescribed view or blade number is the number of views or blades when the acceleration factor is 1 and is derived from the prescribed values of matrix sizes and/or other parameters in the imaging protocol. For example, if the view number has an acceleration factor of 2, the view number is reduced by a factor of 2 or the view number is half of the view number without the acceleration. If the blade number has an acceleration factor of 2, the blade number is reduced to half of the blade number without the acceleration. The reduction in scan time is roughly proportional to the acceleration factor. For example, if the acceleration factor is 2, savings in scan time are roughly 50%.

Figure 4A:
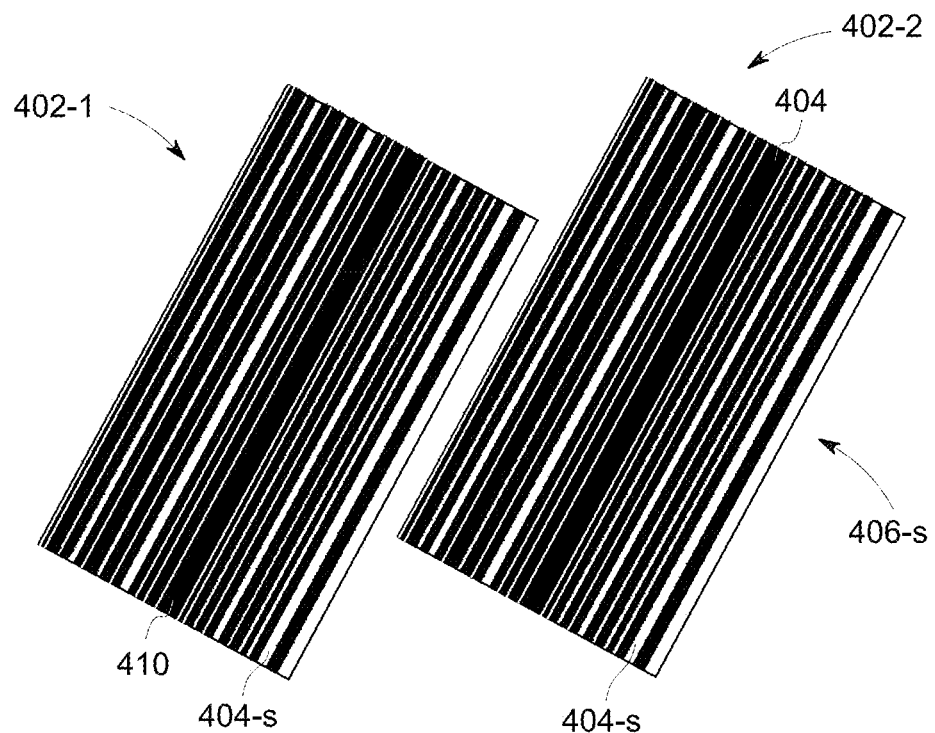
FIG. 4A shows exemplary view undersampling patterns of blades in the systems and methods shown in FIGS. 2A and 2B.
Figure 4B:
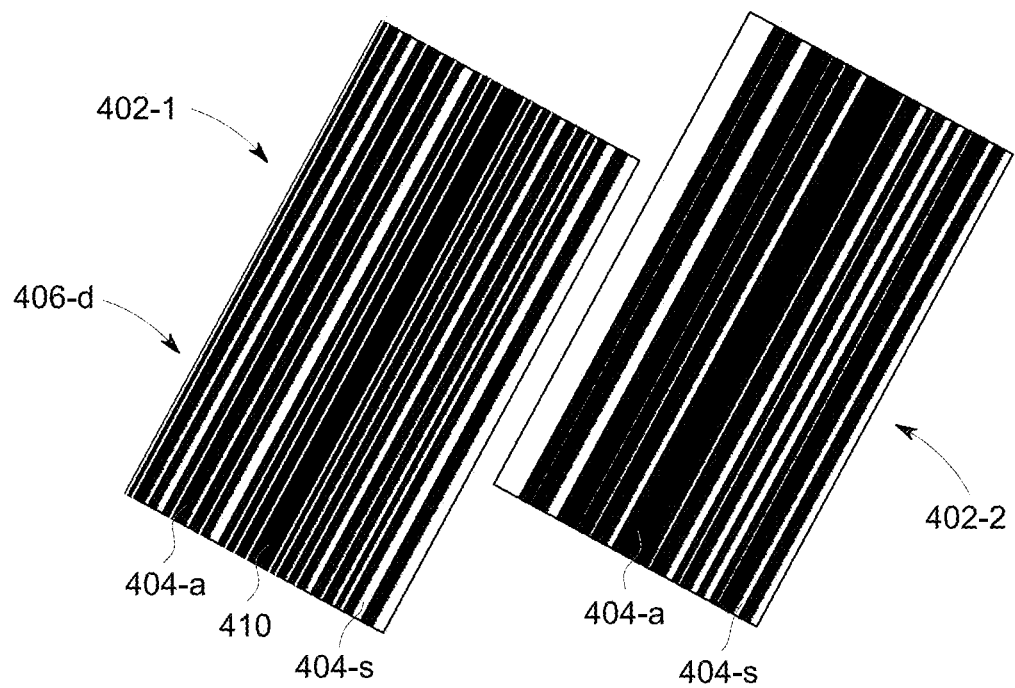
FIG. 4B shows another example of view undersampling patterns of blades.

FIGS. 4A and 4B show exemplary blades 402 with reduced view numbers. In the exemplary embodiment, acquisition of a blade 402 is accelerated by reducing the number of views acquired such as skipping views 404-s. Various view undersampling patterns 406, the pattern of views acquired or skipped, may be applied. In one example, view undersampling patterns 406 may be the same for the blades 402 in the kx-ky plane, where the same views are acquired or skipped for blades 402-1, 402-2 (FIG. 4A).

Alternatively, the view undersampling patterns 406-d may be different for blades 402 in the kx-ky plane, where different views 404 are acquired or skipped for different blades 402-1, 402-2 (FIG. 4B). For example, in FIG. 4B, views acquired 404-a and views skipped 404-s are different for blade 402-1 from blade 402-2. Different view undersampling patterns 406-d across blades 402 provide randomness in the k-space data, which is advantageous in compressed sensing reconstruction.

Figure 5C:
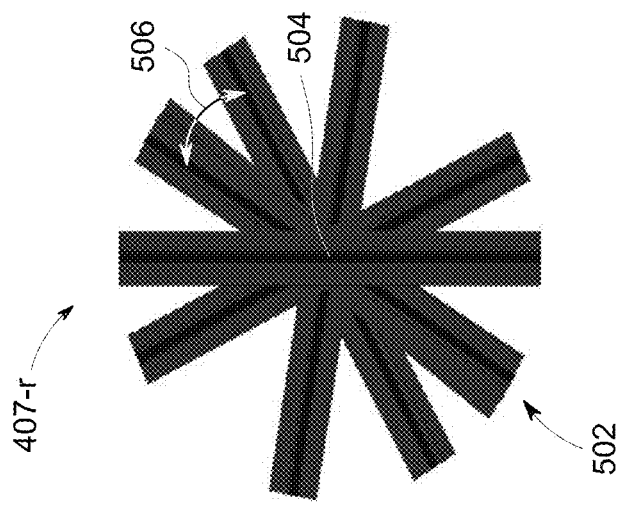
FIG. 5C shows one more exemplary blade undersampling pattern.
Figure 5B:
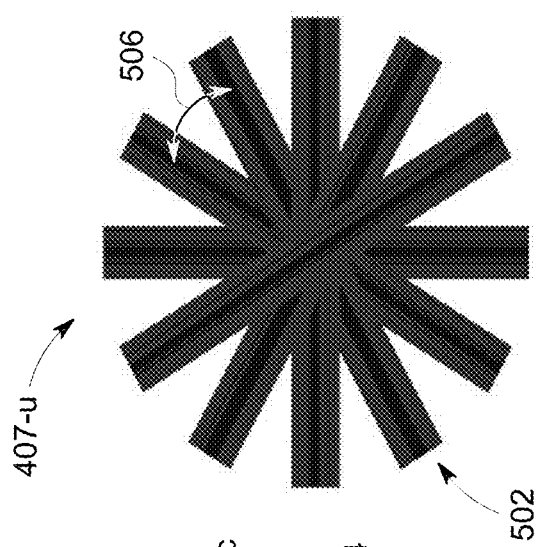
FIG. 5B shows another exemplary blade undersampling pattern.
Figure 5A:
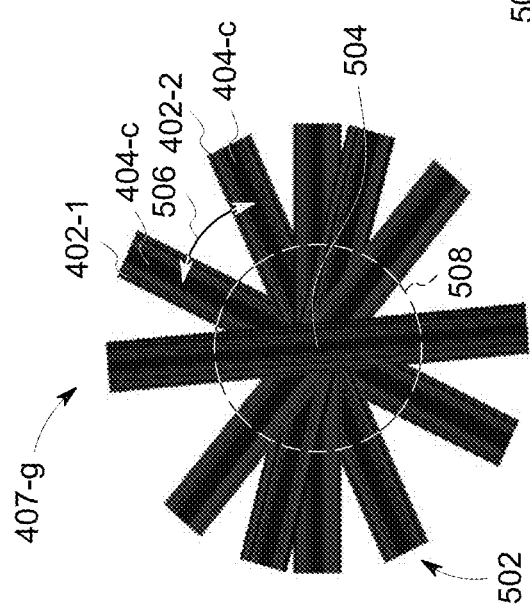
FIG. 5A shows an exemplary blade undersampling pattern.

FIGS. 5A and 5B show exemplary blades 402 with reduced blade numbers. In the exemplary embodiment, scanning a kx-ky plane is accelerated by reducing the number of blades 402 in the kx-ky plane. For example, if the prescribed blade number is 12 and the acceleration factor is 2, 6 blades 402 are acquired for one kx-ky plane in one number of acquisitions (NEX). Various blade undersampling patterns 407 may be used. In one example, in blade undersampling pattern 407-g, the angles 506 between neighboring blades 402-1, 402-2 are golden angles. An angle 506 between two blades 402-1, 402-2 is the angle between center views 404-c of the two blades 402, where center view 404c is the view 404 in a blade 402 that passes through a k-space center 504 of the kx-ky plane 502. Along golden angles, blades 402 partition the kx-ky plane 502, such as a circle 508 in plane 502 with the center as the k-space center 504, by a golden mean.

In one dimension, a one-dimensional (1D) golden mean, or a golden section, partitions a line segment into a longer segment of length x and a shorter segment of a unit length such that:

$$\frac{1}{x} = \frac{x}{x+1}. \tag{3}$$

The larger root of Eq. (3) of 1.618 is called a golden ratio, and the smaller root of 0.618 is called a conjugate golden ratio. Each subsegment of the line segment may be further segmented in the same manner into a larger segment and a smaller segment having the same ratio as expressed in Eq. (3), generating a series of partition points of the line segment. The partition points appear pseudo-random on the line segment. Compared to a set of random points on the line segment which exhibit clusters, the golden point set is spatially and temporally uniformly distributed. That is, the partition points generated as golden means sample a line segment uniformly. Golden means may be generated by other mechanisms, such as by using a Fibonacci sequence, or deriving eigenvalues of matrices after successive Fibonacci transformations.

In the exemplary embodiment, the angles 506 between neighboring blades 402-1, 402-2 are golden angles derived as golden means for partitioning circle 508. As a result, blades 402 partitions the kx-ky plane 502 pseudo randomly and uniformly.

In another example, in blade undersampling pattern 407-u, blades 402 are uniformly distributed around k-space center 504, where the angles 506 between neighboring blades 402-1, 402-2 are the same (FIG. 5B). In one more example, in blade undersampling pattern 407-r, blades 402 are randomly distributed around k-space center 504, where angles 506 between neighboring blades 402-1, 402-2 are random (FIG. 5C). Compared to uniform or random blade undersampling patterns 407-u, 407-r, acquiring with blade undersampling pattern 407-g provides an increased signal to noise (SNR) ratio and a point spread function having reduced sidelobes, thereby reducing aliasing artifacts.

Figure 6:
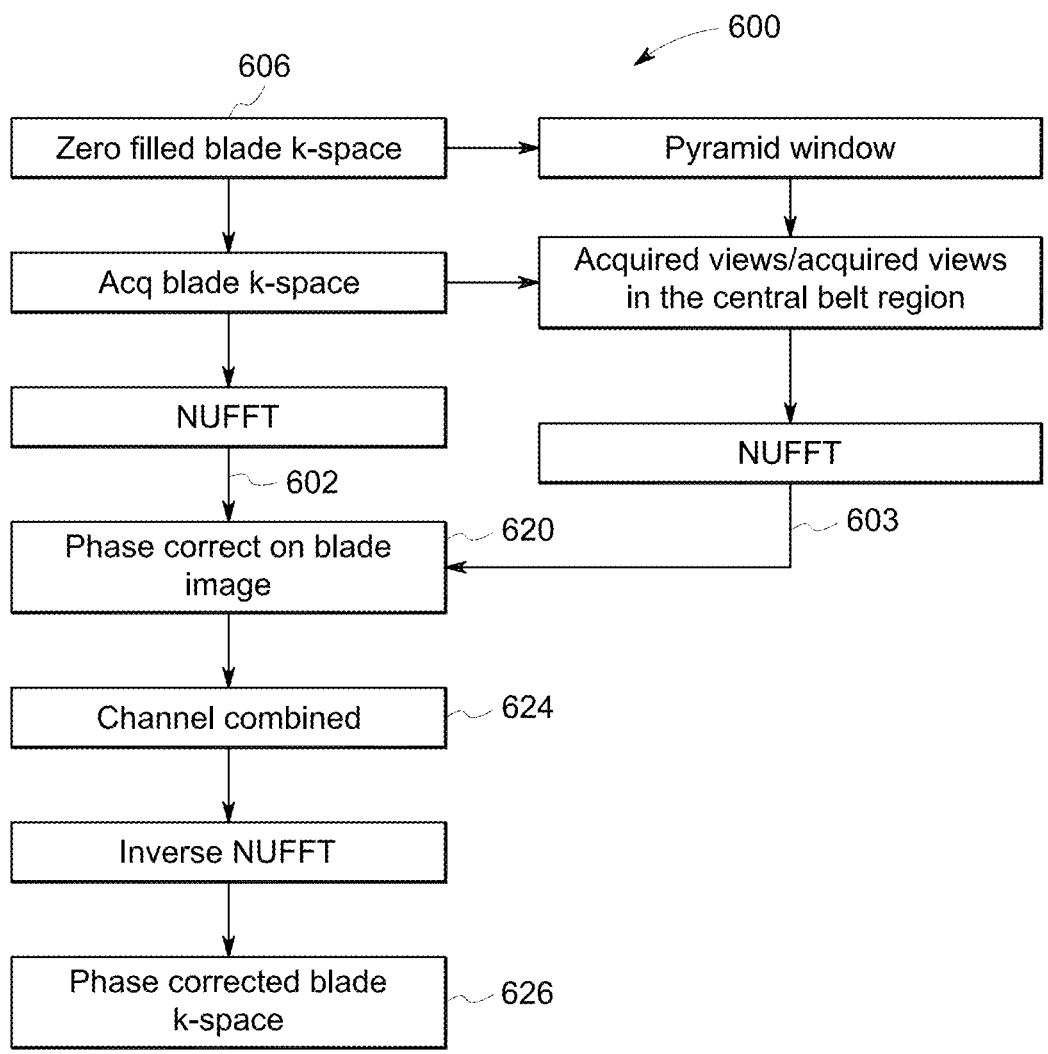
FIG. 6 is a flow chart of an exemplary method of phase correction.

FIG. 6 is a flow chart of an exemplary method 600 of phase correction. A phase correction may be applied to each blade 402 to align the point of rotation of the blade 402 to the center of the kx-ky plane 502 to reduce errors in the k-space locations that correspond to the k-space data. Generally, the point of rotation of blades is not the center of the k-space, due to imperfect gradient balancing and eddy current. In the exemplary embodiment, method 600 includes deriving a phase map in the image space. The phases of the blade image are corrected by removing corresponding phases in the phase map. In generating a phase map, blade k-space data, k-space data corresponding to blade 402, are applied with a pyramid window, which has a triangular function. An image 603 of the filtered blade k-space data or filtered blade image 603 is derived using NUFFT. As used herein, a blade image is an image corresponding to a blade, and is reconstructed based on blade k-space data corresponding to the blade. NUFFT may be performed on all acquired views in the blade. Alternatively, NUFFT may be performed only on acquired views in the central belt region 410 of the blade (see FIGS. 4A and 4B). Using all acquired views provides better phase correction than using the central belt region only. Image 603 is used to derive a phase map of the phases at each pixel. In some embodiments, the blade k-space data may be zero filled 606, where unacquired views are filled 606 with zeros. In deriving the phase map, the zero-filled blade k-space data are applied with a pyramid window.

As described above, in Cartesian acquisition, k space data may be placed directly into standard array processors designed for FFT computations. When the k-space is in an undersampled non-Cartesian pattern, FFT may not be directly used to reconstruct images from the k-space data. In the exemplary embodiment, an NUFFT is used, which does not require the k-space data sampled on the Cartesian grid or uniformly distributed.

As described above, a Fourier relationship exists between the acquired MR signals and an image of the subject and therefore an image may be reconstructed by applying an inverse Fourier transform to the k-space data, as shown in Eq. (4) below when the sampling is in 2D:

$$I(x,y) = \iint S(k_x, k_y) e^{2\pi i(xk_x + yk_y)} dk_x dk_y, \quad (4)$$

where I(x, y) represents the image at location (x, y) in real space, $S(k_x, k_y)$ represents k-space data at the k-space location $(k_x, k_y)$. The continuous integral is typically approximate by discrete Fourier transform as in Eqn. (5) below.

$$I(x,y) = \Sigma\Sigma S(k_x, k_y) e^{2\pi i(xk_x + yk_y)} \Delta k_x \Delta k_y \quad (5)$$

When the k-space is sampled along a Cartesian grid, the weightings of $\Delta k_x \Delta k_y$ in Eqn. (5) is constant across kx's and ky's and the reconstruction may be accomplished by directly applying FFT of the k-space data. When the k-space sampling is nonuniform, which is not along a Cartesian grid, the weightings of $\Delta k_x \Delta k_y$ change at different sampling point of $(k_x, k_y)$. The weightings $\Delta k_x \Delta k_y$ may be approximated. In one example, the weightings $\Delta k_x \Delta k_y$ are approximated using the Voronoi area associated with the k-space point $(k_x, k_y)$, where the Voronoi area associated with a k-space sample point is the area of the set of k-space sample points that are closer to that point than all other k-space sample points. Due to the nonuniformity of $(k_x, k_y)$, reconstruction in Eqn. (5) will not accomplished by directly applying FFT on the k-space data, even after the applying the weightings $\Delta k_x \Delta k_y$. FFT may be used to approximate and increase the computation speed of NUFFT. For example, an FFT of the acquired data are performed and the non-uniform Fourier transformed data are derived by interpolating data transformed with the FFT.

In the exemplary embodiment, an NUFFT is applied to the blade k-space data, or zero-filled blade k-space data if zero-filling 606 is applied, to derive a pre-phase correction blade image 602. The phases in pre-phase correction blade image 602 are corrected using the phase map generated using the filtered blade image 603.

In the exemplary embodiment, if multi-channels or coils are used to acquire k-space data, the phase corrected blade image 620 from each channel is combined using the coil sensitivity map to derive channel-combined phase-corrected blade image 624 for the blade.

In the exemplary embodiment, an inverse NUFFT is applied to phase corrected blade image 620, or combined phase corrected blade image 624 if multi-channels are used, to derive phase corrected blade k-space data 626. Phase corrected blade k-space data 626 for all blades in the kx-ky plane are stacked together to derive phase corrected k-space data for the entire kx-ky plane of a slice or slice-encoding step, which are further processed and/or are reconstructed to generate an image.

In the exemplary embodiment, motion correction may be applied to identify motion-corrupted blades 402. Motion-corrupted blades are blades acquired during motion and/or being affected by motion in such a degree that the k-space data of the blade should be discarded or contribute less than other blades to the k-space data of the kx-ky plane used during image reconstruction.

Figure 7A:
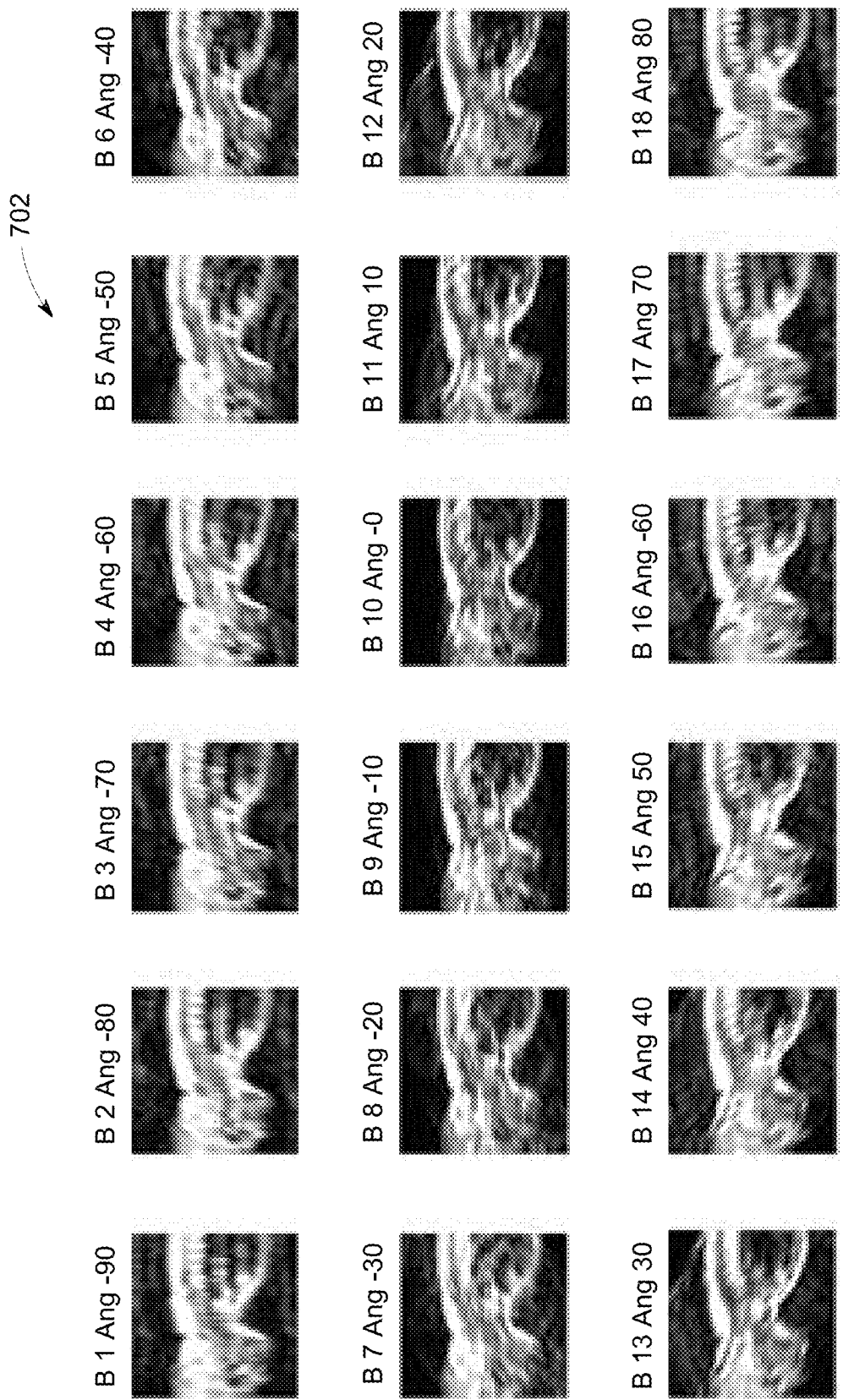
FIG. 7A shows blade images.
Figure 7B:
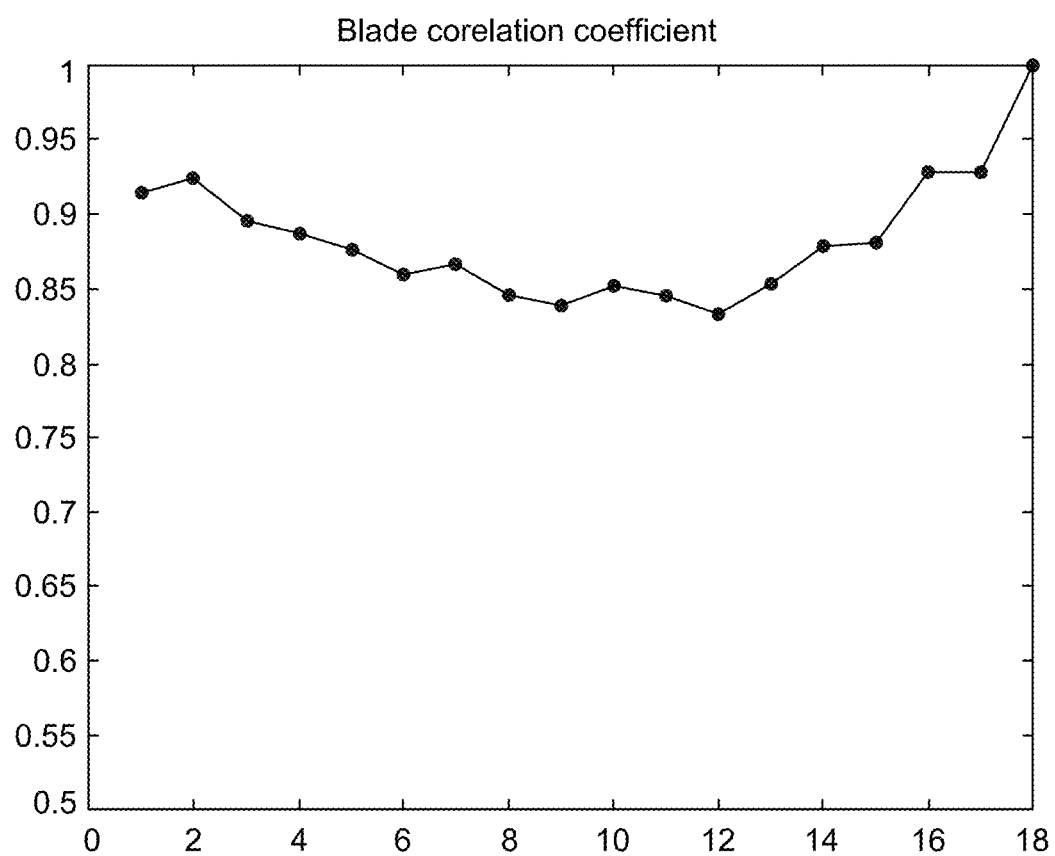
FIG. 7B is a plot of cross-correlation coefficients of the blade images shown in FIG. 7A with a reference image.

FIGS. 7A and 7B show a method of motion correction. A blade image may be derived by applying an FFT to the blade k-space data of the corresponding blade. For example, if a blade 402 has 16 views, an FFT may be applied to the 16 lines of k-space data. If blade 402 is undersampled with a view undersampling pattern, zeros may be filled to the unacquired lines and an FFT is applied to the zero-filled k-space data to derive a blade image. Because blades rotate during acquisition, blade images derived by directly applying FFT to the blade k-space data would rotate, rendering comparison of blade images to one another cumbersome. In the motion correction of the systems and methods described herein, an NUFFT is used instead to derive blade image 702 corresponding to blade 402 (see FIG. 7A). In the exemplary embodiment, an NUFFT is applied to blade k-space data of each blade in a kx-ky plane to derive a blade image 702 corresponding to that blade. In some embodiments, the NUFFT may be applied to the phase corrected blade k-space data 626 (see FIG. 6). As shown in FIG. 7A, blade images 702 reconstructed using NUFFT have the same orientations. The reconstructed blade images 702 are therefore used to detect the blade(s) that are motion corrupted and post-processing the corresponding blade k-space data and/or blade images.

In the exemplary embodiment, a reference image is generated. The reference image may be a sum or an average of blade images 702 of the same slice or slice encoding step. A cross-correlation coefficient of blade image 702 with the reference image is calculated. FIG. 7B shows cross correlation coefficients of blade images with the reference image. A motion-corrupted blade may be detected by thresholding the cross correlation coefficients. An exemplary threshold may be 0.5 or 0.65. If the cross correlation coefficient of a blade is less than the threshold, the blade is determined to be motion corrupted, indicating the subject moved during the acquisition of the blade. The motion-corrupted blade may be post-processed by removing the blade k-space data of the motion-corrupted blade from the k-space data for reconstructing 252 images. Alternatively, the motion-corrupted blade is downgraded by applying a weighting to the blade k-space data. The weighting may be equal or proportional to the cross-correlation coefficient of the blade. In some embodiments, the weighting is a constant value less than 1.

In some embodiments, further motion correction or other correction may be applied to the k-space data. Motion-correction described herein may be applied in combination with other correction techniques. For example, further correction may be applied to the motion-corrected k-space data described herein.

Figure 8A:
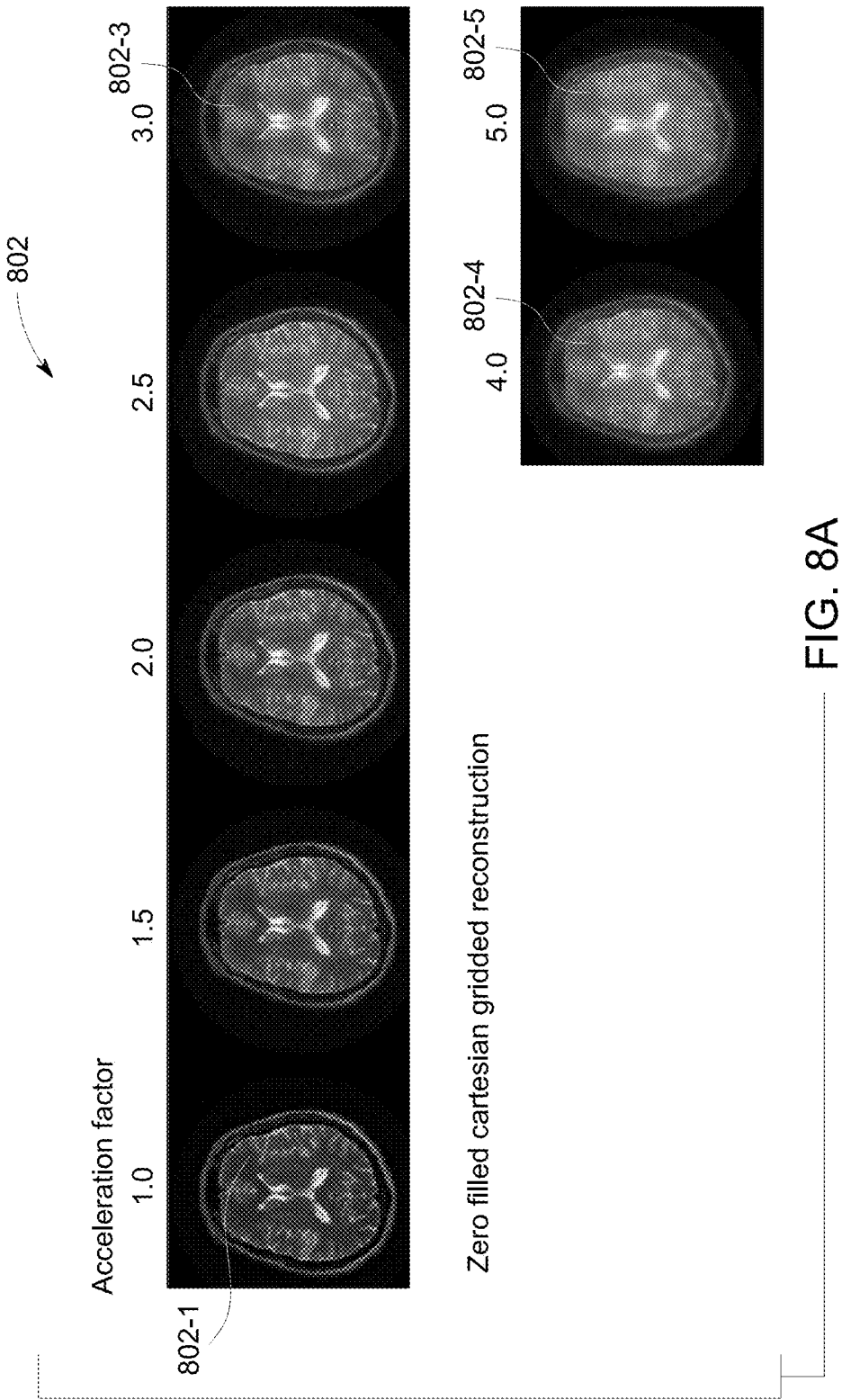
FIG. 8A shows images reconstructed by zero-filled re-gridding.

In MR, images are reconstructed based on the k-space data. To improve the image quality, phase correction and/or motion correction may be applied and the phase and/or motion corrected k-space data are used as an input to reconstruct images. The images may be reconstructed by filling the un-sampled views or blades with zeros and re-grid the k-space data to a Cartesian grid before applying an FFT to derive reconstructed images. FIG. 8A shows a zero-filled re-gridding reconstructed axial image 802 of the same slice acquired with the pulse sequence as described herein, having an acceleration factor from 1-5. When the acceleration factor is 1, undersampling schemes described above are not applied. As the acceleration factor increases or the k-space is more sparsely sampled, the reconstructed images start to have artifacts such as haze, streaks, and/or noisy structures, which may render the images clinically unacceptable for diagnosis purposes. For example, images 802-3, 802-4, 802-5 appear as if a haze is placed over the image, compared to images 802-1. In zero-filled re-gridding reconstruction, the effect of zero-filled and re-gridding is that the k-space data at the missing sample points are replaced with Fourier interpretation of acquired k-space data, causing the artifacts.

Figure 8B:
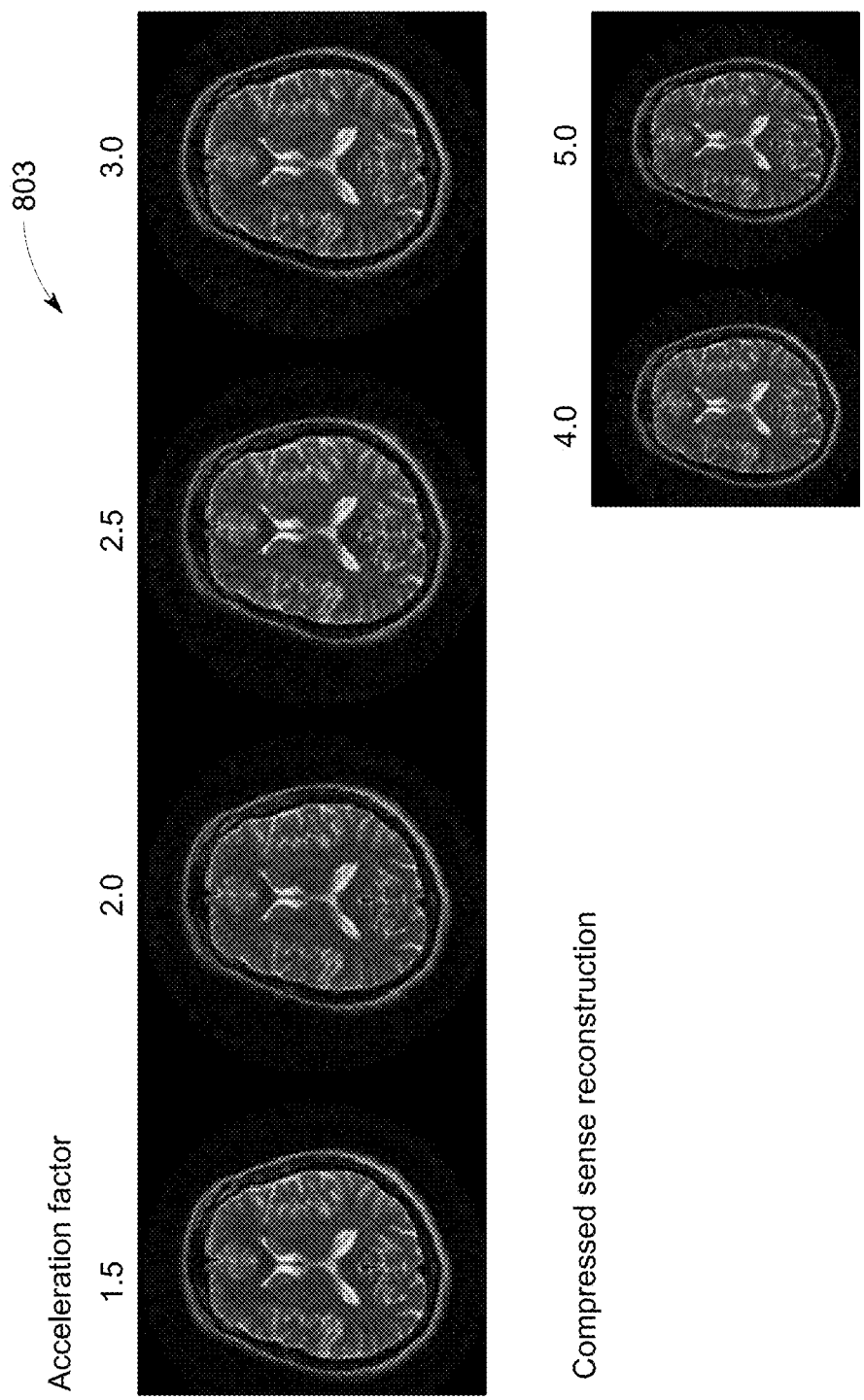
FIG. 8B shows images reconstructed by compressed sensing.

In the exemplary embodiment, compressed sensing is used in reconstructing 252 images based on the undersampled k-space data using the undersampling schemes described above. FIG. 8B are images 803 reconstructed using compressed sensing based on the same k-space data as used in reconstruct images 802. Compared to images 802, artifacts such as haze artifacts are largely reduced.

Figure 9:
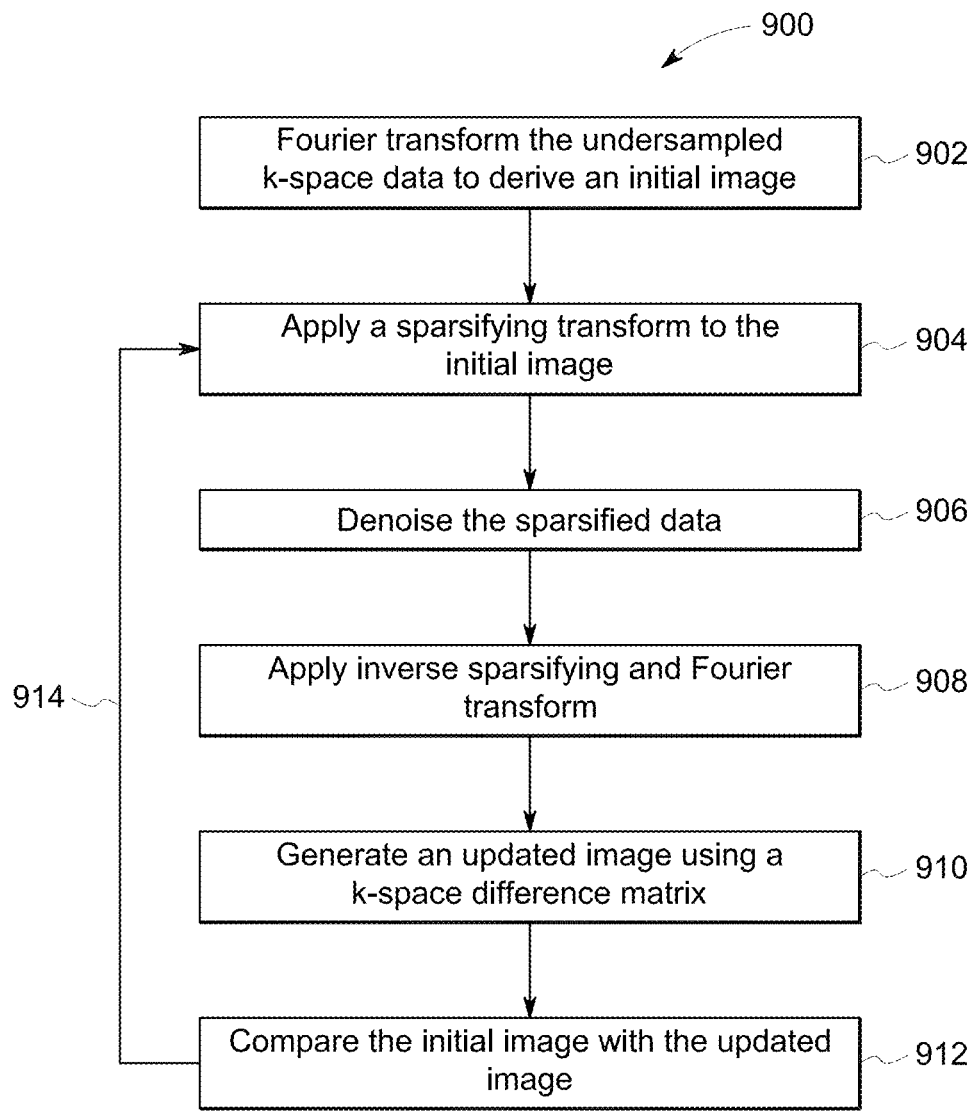
FIG. 9 is a flow chart of an exemplary method of compressed sensing.

FIG. 9 is a flow chart of compressed sensing 900. In the exemplary embodiment, compressed sensing 900 includes Fourier transforming 902 the undersampled k-space data to derive an initial image. An NUFFT is applied to the k-space data to reconstruct an initial image. In some embodiments, Voronoi diagrams are used as sampling density correction factors. Alternatively, zero-filled re-gridding is used to reconstruct an initial image. Using an initial image reconstructed by NUFFT with Voronoi-based sampling density correction factor provides a faster convergence to an optimal final image than using other reconstruction methods such as zero-filled re-gridding.

In the exemplary embodiment, compressed sensing 900 further includes applying 904 a sparsifying transform of the initial image. An exemplary sparsifying transform is a wavelet decomposition. After the sparsifying transform, meaningful image characteristics are concentrated to a small number of high-intensity pixels and aliasing noise has low intensity and spread into many pixels, most in the background. The aliasing noise in the sparsified data is removed or reduced 906 by methods such as thresholding to replace pixels with values below a threshold with zeros, filtering, and/or subtraction. The denoised sparsified data is converted back to the k-space to derive denoised k-space data by applying 908 an inverse sparsifying transform and inverse Fourier transform such as inverse NUFFT to the denoised sparsified data. A difference k-space data is generated 910 by subtracting the original k-space data from the denoised k-space data. By Fourier transform, such as NUFFT, the difference k-space data, a difference image is created and is added to the initial image to derive an updated image. The initial image is compared 912 with the updated image. If the difference between initial image and the updated image is above a threshold, the updated image is set as the initial image, repeating 914 the processes from applying 904 to generating 910 until the difference is below the threshold. In the optimizing process 914, an L1 conjugate gradient optimization may be used.

Compressed sensing performs better, e.g., providing better image quality or converging faster to an optimized image, for semi-random undersampling patterns than coherent or random undersampling patterns. In the undersampling patterns shown in FIGS. 4A-5C, compressed sensing on k-space data acquired with undersampling pattern 406-d, where different blades have different undersampling patterns, performs better than on k-space data acquired with undersampling pattern 406-s, where blades have the same undersampling patters. Among various blade undersampling patterns, compressed sensing on k-space data acquired with undersampling pattern 407-g (FIG. 5A), where angles 506 between neighboring blades are golden angles, performs better than on k-space data acquired with undersampling pattern 407-u or 407-r, where the angles 506 between neighboring blades 402 are uniform (407-u, FIG. 5B) or random (407-r, FIG. 5C).

Figure 10:
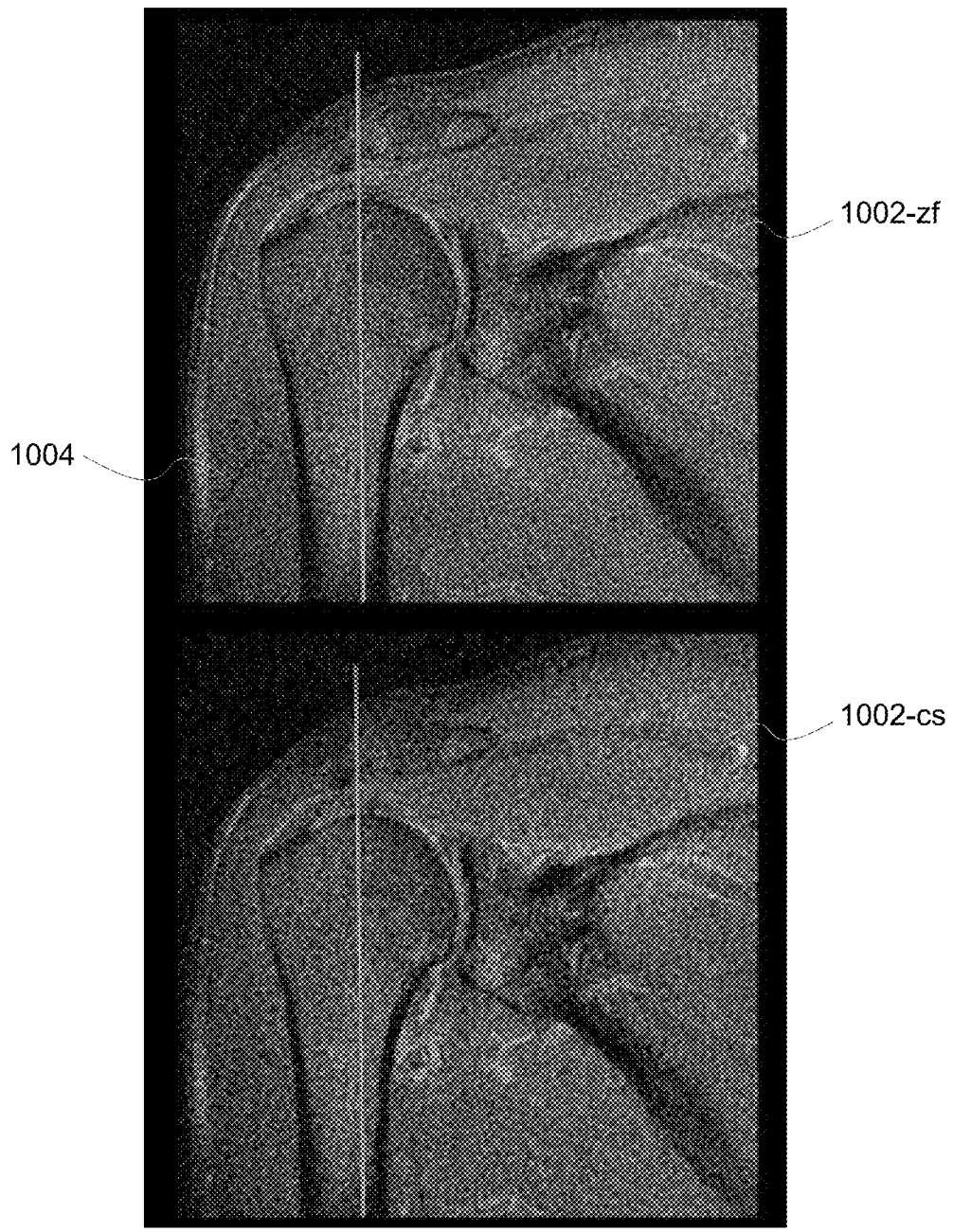
FIG. 10 is a comparison of images reconstructed by zero-filled re-gridding and by compressed sensing.

FIG. 10 shows another comparison between zero-filled re-gridding reconstructed image 1002-zf and compressed sensing reconstructed image 1002-cs. Images 1002-zf, 1002-cs are reconstructed based on the same k-space data. Compare to image 1002-zf, artifacts 1004 are reduced in image 1002-cs.

Figure 11:
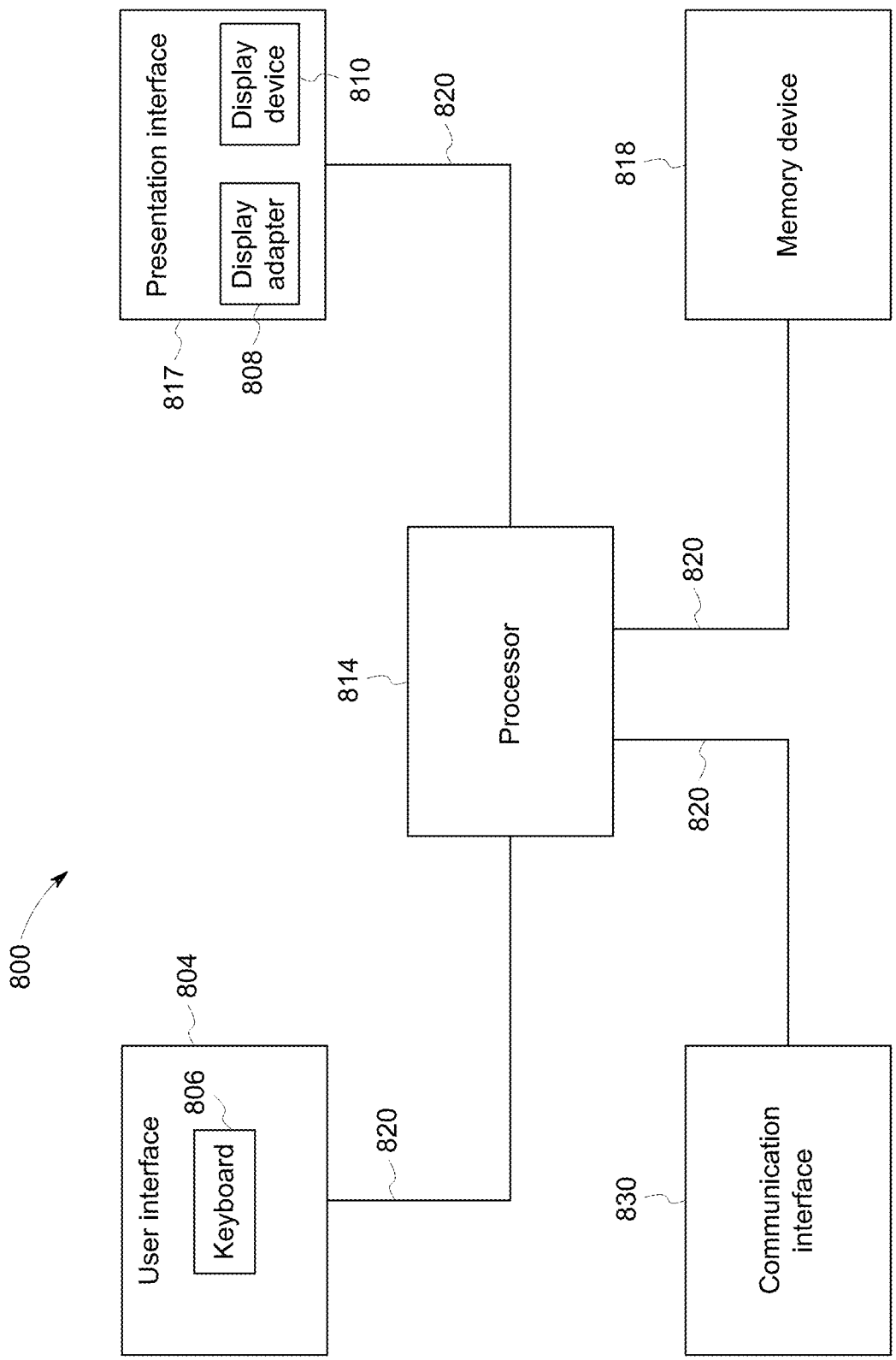
FIG. 11 is a block diagram of an exemplary computing device.

Workstation 12 and imaging acceleration computing device 202 described herein may be any suitable computing device 800 and software implemented therein. FIG. 11 is a block diagram of an exemplary computing device 800. In the exemplary embodiment, computing device 800 includes a user interface 804 that receives at least one input from a user. User interface 804 may include a keyboard 806 that enables the user to input pertinent information. User interface 804 may also include, for example, a pointing device, a mouse, a stylus, a touch sensitive panel (e.g., a touch pad and a touch screen), a gyroscope, an accelerometer, a position detector, and/or an audio input interface (e.g., including a microphone).

Moreover, in the exemplary embodiment, computing device 800 includes a presentation interface 817 that presents information, such as input events and/or validation results, to the user. Presentation interface 817 may also include a display adapter 808 that is coupled to at least one display device 810. More specifically, in the exemplary embodiment, display device 810 may be a visual display device, such as a cathode ray tube (CRT), a liquid crystal display (LCD), a light-emitting diode (LED) display, and/or an "electronic ink" display. Alternatively, presentation interface 817 may include an audio output device (e.g., an audio adapter and/or a speaker) and/or a printer.

Computing device 800 also includes a processor 814 and a memory device 818. Processor 814 is coupled to user interface 804, presentation interface 817, and memory device 818 via a system bus 820. In the exemplary embodiment, processor 814 communicates with the user, such as by prompting the user via presentation interface 817 and/or by receiving user inputs via user interface 804. The term "processor" refers generally to any programmable system including systems and microcontrollers, reduced instruction set computers (RISC), complex instruction set computers (CISC), application specific integrated circuits (ASIC), programmable logic circuits (PLC), and any other circuit or processor capable of executing the functions described herein. The above examples are exemplary only, and thus are not intended to limit in any way the definition and/or meaning of the term "processor."

In the exemplary embodiment, memory device 818 includes one or more devices that enable information, such as executable instructions and/or other data, to be stored and retrieved. Moreover, memory device 818 includes one or more computer readable media, such as, without limitation, dynamic random access memory (DRAM), static random access memory (SRAM), a solid state disk, and/or a hard disk. In the exemplary embodiment, memory device 818 stores, without limitation, application source code, application object code, configuration data, additional input events, application states, assertion statements, validation results, and/or any other type of data. Computing device 800, in the exemplary embodiment, may also include a communication interface 830 that is coupled to processor 814 via system bus 820. Moreover, communication interface 830 is communicatively coupled to data acquisition devices.

In the exemplary embodiment, processor 814 may be programmed by encoding an operation using one or more executable instructions and providing the executable instructions in memory device 818. In the exemplary embodiment, processor 814 is programmed to select a plurality of measurements that are received from data acquisition devices.

In operation, a computer executes computer-executable instructions embodied in one or more computer-executable components stored on one or more computer-readable media to implement aspects of the invention described and/or illustrated herein. The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Figure 12:
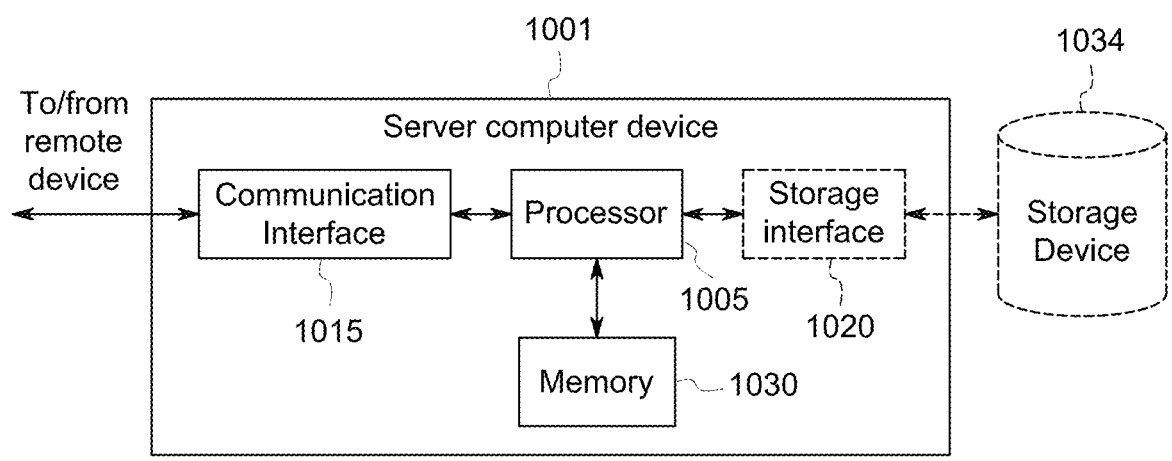
FIG. 12 is a schematic diagram of a server computing device.

FIG. 12 illustrates an exemplary configuration of a server computer device 1001 such as computing device 202. Server computer device 1001 also includes a processor 1005 for executing instructions. Instructions may be stored in a memory area 1030, for example. Processor 1005 may include one or more processing units (e.g., in a multi-core configuration).

Processor 1005 is operatively coupled to a communication interface 1015 such that server computer device 1001 is capable of communicating with a remote device or another server computer device 1001. For example, communication interface 1015 may receive data from workstation 12, via the Internet.

Processor 1005 may also be operatively coupled to a storage device 1034. Storage device 1034 is any computer-operated hardware suitable for storing and/or retrieving data, such as, but not limited to, wavelength changes, temperatures, and strain. In some embodiments, storage device 1034 is integrated in server computer device 1001. For example, server computer device 1001 may include one or more hard disk drives as storage device 1034. In other embodiments, storage device 1034 is external to server computer device 1001 and may be accessed by a plurality of server computer devices 1001. For example, storage device 1034 may include multiple storage units such as hard disks and/or solid state disks in a redundant array of inexpensive disks (RAID) configuration. storage device 1034 may include a storage area network (SAN) and/or a network attached storage (NAS) system.

In some embodiments, processor 1005 is operatively coupled to storage device 1034 via a storage interface 1020. Storage interface 1020 is any component capable of providing processor 1005 with access to storage device 1034. Storage interface 1020 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing processor 1005 with access to storage device 1034.

At least one technical effect of the systems and methods described herein includes (a) reduction of scan time via PROPELLER undersampling schemes; (b) compressed sensing reconstruction to reduce artifacts caused by undersampling; (c) phase correction; (d) motion correction; (e) applying NUFFT to generate an initial image for compressed sensing; and (0 applying Voronoi based density correction factor to accelerate convergence in compressed sensing.

Exemplary embodiments of systems and methods of imaging acceleration are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A magnetic resonance (MR) imaging acceleration method, comprising:
applying, by an MR system, a pulse sequence having a k-space trajectory of a plurality of blades being rotated ink-space, each blade including a plurality of views, wherein the k-space trajectory has an undersampling pattern in the k-space, wherein applying a pulse sequence further comprises:

reducing a number of views in a blade in a view undersampling pattern while maintaining a size of the blade;

receiving k-space data of a subject acquired by the pulse sequence;

reconstructing MR images of the subject based on the k-space data using compressed sensing; and outputting the reconstructed images.

2. The method of claim 1, wherein a first blade has a first view undersampling pattern, and a second blade has a second view undersampling pattern different from the first view undersampling pattern.

3. The method of claim 1, wherein applying a pulse sequence further comprises:

reducing blade numbers in a kx-ky plane in a blade undersampling pattern.

4. The method of claim 3, wherein angles between neighboring blades are golden angles.

5. The method of claim 3, wherein angles between neighboring blades are randomized.

6. The method of claim 1, wherein reconstructing MR images further comprises:

correcting phases by:
for each blade of the plurality of blades,
generating a phase image based on blade k-space data using nonuniform Fourier transform;
generating a phase corrected blade image based on the phase image; and
generating phase corrected blade k-space data based on the phase corrected blade image; and
reconstructing MR images based on phase corrected blade k-space data of the plurality of blades.

7. The method of claim 6, wherein generating a phase image further comprises generating the phase image based on k-space data of views in a central belt region.

8. The method of claim 1, wherein reconstructing MR images further comprises:

correcting motion by:
for each blade of the plurality of blades,
reconstructing a blade image based on blade k-space data using nonuniform Fourier transform;
computing a cross-correlation coefficient between the blade image and a reference image; and
determining whether the blade is motion corrupted by comparing the cross-correlation coefficient with a threshold; and
post-processing the motion-corrupted blade.

9. The method of claim 8, wherein correcting motion further comprises generating the reference image based on blade images of the plurality of blades as an averaged image of the blade images corresponding to the plurality of blades.

10. The method of claim 8, wherein post-processing the motion-corrupted blade further comprises applying a weight to blade k-space data of the motion-corrupted blade.

11. The method of claim 8, wherein post-processing the motion-corrupted blade further comprises discarding blade k-space data of the motion-corrupted blade in reconstructing MR images.

12. The method of claim 1, wherein reconstructing MR images further comprises:

generating an initial image of compressed sensing by applying nonuniform Fourier transform to the k-space data weighted by Voronoi diagrams of a sampling pattern of the k-space trajectory.

13. A magnetic resonance (MR) imaging acceleration system, comprising an imaging acceleration computing device, the imaging acceleration computing device comprising at least one processor in communication with at least one memory device, and the at least one processor programmed to:

receive k-space data of a subject acquired by a pulse sequence having a k-space trajectory of a plurality of blades being rotated in k-space, each blade including a plurality of views, wherein the k-space trajectory has an undersampling pattern, wherein in the pulse sequence, a number of views in a blade is reduced in a view undersampling pattern while maintaining a size of the blade;

reconstruct MR images of the subject based on the k-space data using compressed sensing; and output the reconstructed images.

14. The system of claim 13, wherein a first blade has a first view undersampling pattern, and a second blade has a second view undersampling pattern different from the first view undersampling pattern.

15. The system of claim 13, wherein a number of blades in a kx-ky plane is reduced, and angles between neighboring blades are golden angles.

16. The system of claim 13, wherein the at least one processor IS further programmed to:

correct phases by:
for each blade of the plurality of blades,
generating a phase image based on blade k-space data using nonuniform Fourier transform;
generating a phase corrected blade image based on the phase image; and
generating phase corrected blade k-space data based on the phase corrected blade image; and
reconstruct MR images based on phase corrected blade k-space data of the plurality of blades.

17. The system of claim 13, wherein the at least one processor IS further programmed to:

correct motion by:
for each blade of the plurality of blades,
reconstructing a blade image based on blade k-space data using nonuniform Fourier transform;
computing a cross-correlation coefficient between the blade image and a reference image; and
determining whether the blade is motion corrupted by comparing the cross-correlation coefficient with a threshold; and
post-processing the motion-corrupted blade.

18. The system of claim 17, wherein the at least one processor is further programmed to:

generate the reference image based on blade images of the plurality of blades as an averaged image of the blade images corresponding to the plurality of blades; and post-process the motion-corrupted blade by applying a weight to blade k-space data of the motion-corrupted blade.

19. The system of claim 13, wherein the at least one processor is further programmed to:

generate an initial image of compressed sensing by applying nonuniform Fourier transform to the k-space data weighted by Voronoi diagrams of a sampling pattern of the k-space trajectory.

* * * * *